(12) United States Patent
Ma et al.

(10) Patent No.: US 10,216,058 B2
(45) Date of Patent: Feb. 26, 2019

(54) DISPLAY DEVICES AND THE DISPLAY PANELS THEREOF

(71) Applicant: Wuhan China Star Optoelectronics Technology Co., Ltd., Wuhan, Hubei (CN)

(72) Inventors: Liang Ma, Guangdong (CN); Mang Zhao, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 87 days.

(21) Appl. No.: 15/326,551

(22) PCT Filed: Jan. 7, 2017

(86) PCT No.: PCT/CN2017/070518
§ 371 (c)(1),
(2) Date: Jan. 16, 2017

(87) PCT Pub. No.: WO2018/040468
PCT Pub. Date: Mar. 8, 2018

(65) Prior Publication Data
US 2018/0210249 A1 Jul. 26, 2018

(30) Foreign Application Priority Data
Aug. 29, 2016 (CN) .......................... 2016 1 0754877.9

(51) Int. Cl.
*G02F 1/1368* (2006.01)
*G02F 1/1362* (2006.01)
(Continued)

(52) U.S. Cl.
CPC .......... *G02F 1/1368* (2013.01); *G02F 1/1362* (2013.01); *G02F 1/136209* (2013.01);
(Continued)

(58) Field of Classification Search
CPC ................................................. G02F 1/136213
See application file for complete search history.

(56) References Cited

U.S. PATENT DOCUMENTS 9,153,700 B2  10/2015  Yang et al.
2010/0193790 A1  8/2010  Yeo et al.
(Continued)

FOREIGN PATENT DOCUMENTS

CN  101728265 A  6/2010
CN  101825815 A  9/2010
(Continued)

*Primary Examiner* — Kendrick Hsu
(74) *Attorney, Agent, or Firm* — Andrew C. Cheng

(57) ABSTRACT

The present disclosure relates to a display panel including a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer. The present disclosure also relates to a display device. With such configuration, the leakage current of the TFTs may be reduced, which also reduces the cross-talk and the flicker of the liquid crystal panel.

20 Claims, 2 Drawing Sheets

(51) Int. Cl.
*H01L 29/786* (2006.01)
*G02F 1/1343* (2006.01)

(52) U.S. Cl.
CPC .... *H01L 29/7869* (2013.01); *H01L 29/78609* (2013.01); *H01L 29/78624* (2013.01); *H01L 29/78633* (2013.01); *H01L 29/78696* (2013.01); *G02F 1/134363* (2013.01); *G02F 1/136213* (2013.01); *G02F 1/136227* (2013.01); *G02F 2001/13685* (2013.01); *G02F 2001/134372* (2013.01)

(56) References Cited

U.S. PATENT DOCUMENTS

| | | | |
|---|---|---|---|
| 2012/0061665 A1* | 3/2012 | Miyake | H01L 27/1225 257/43 |
| 2013/0001579 A1 | 1/2013 | Jung et al. | |
| 2014/0312320 A1 | 10/2014 | Yang et al. | |

FOREIGN PATENT DOCUMENTS

| | | | |
|---|---|---|---|
| CN | 104122684 A | 10/2014 |
| CN | 106125432 A | 11/2016 |
| JP | 2003318403 A | 11/2003 |
| JP | 200533009 A | 2/2005 |

\* cited by examiner

DISPLAY DEVICES AND THE DISPLAY PANELS THEREOF

BACKGROUND OF THE INVENTION

1. Field of the Invention

The present disclosure relates to display technology, and more particularly to a display device and the display panel thereof.

2. Discussion of the Related Art

LCDs typically are characterized by attributes including thin, power-saving, and low radiation, and thus are very popular display devices. Currently, cellular phones often adopt Fringe Field Switching (FFS) display mode for the reason that the viewing angle is wider and may not be easily affected by the thickness of the liquid crystal cell.

With respect to liquid crystal panel, thin film transistor (TFT) components may have the electrical leakage issue. A greater storage capacitance (Cst) has to be configured to prevent the grayscale value of the pixels from TFT electrical leakage within one frame. The unstable grayscale value may downgrade the optical performance of the display panel, such as cross-talk and flicker. However, the storage capacitance (Cst) may be affected by the resolution rate and the aperture rate.

Thus, a new display device and a display panel have to be proposed to solve the above issues.

SUMMARY

The present disclosure relates to a display device and a liquid crystal panel for reducing the cross-talk and the flicker.

In one aspect, a display panel includes: a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer; wherein the active layer includes an intrinsic portion, a first light-doping porting and a second light-doping portion respectively arranged at two lateral sides of the intrinsic portion, a first heavy-doping portion arranged at one side of the first light-doping porting facing away the intrinsic portion, a second heavy-doping portion arranged at one side of the second light-doping portion facing away the intrinsic portion, and the intrinsic portion completely covers the first semiconductor layer; the display panel further includes a second semiconductor layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

Wherein at least a portion of the second heavy-doping portion is on the second semiconductor layer.

Wherein the second metal layer includes a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

In another aspect, a display panel includes: a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer.

Wherein the active layer includes an intrinsic portion, a first light-doping porting and a second light-doping portion respectively arranged at two lateral sides of the intrinsic portion, a first heavy-doping portion arranged at one side of the first light-doping porting facing away the intrinsic portion, a second heavy-doping portion arranged at one side of the second light-doping portion facing away the intrinsic portion, and the intrinsic portion completely covers the first semiconductor layer.

Wherein the display panel further includes a second semiconductor layer on the buffering layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

Wherein the active layer includes an intrinsic portion, a first light-doping porting and a second light-doping portion respectively arranged at two lateral sides of the intrinsic portion, a first heavy-doping portion arranged at one side of the first light-doping porting facing away the intrinsic portion, a second heavy-doping portion arranged at one side of the second light-doping portion facing away the intrinsic portion, and the intrinsic portion partially covers the first semiconductor layer.

Wherein the second metal layer includes a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

Wherein the first semiconductor layer and the second semiconductor layer are N-type semiconductor layers.

Wherein the first semiconductor layer and the second semiconductor layer are made by indium gallium zinc oxide (IGZO).

Wherein the display panel further includes a color filter arranged on the second substrate.

Wherein the active layer is a polysilicon semiconductor layer, and the display panel is a fringe field switching (FFS) display panel.

In another aspect, a display device includes: a display panel and a backlight module providing a backlight to the display panel, the display panel includes: a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer.

Wherein the active layer includes an intrinsic portion, a first light-doping porting and a second light-doping portion respectively arranged at two lateral sides of the intrinsic portion, a first heavy-doping portion arranged at one side of the first light-doping porting facing away the intrinsic portion, a second heavy-doping portion arranged at one side of the second light-doping portion facing away the intrinsic portion, and the intrinsic portion completely covers the first semiconductor layer.

Wherein the display panel further includes a second semiconductor layer on the buffering layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

Wherein the active layer includes an intrinsic portion, a first light-doping porting and a second light-doping portion respectively arranged at two lateral sides of the intrinsic portion, a first heavy-doping portion arranged at one side of the first light-doping porting facing away the intrinsic portion, a second heavy-doping portion arranged at one side of the second light-doping portion facing away the intrinsic portion, and the intrinsic portion partially covers the first semiconductor layer.

Wherein the second metal layer includes a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

Wherein the first semiconductor layer and the second semiconductor layer are N-type semiconductor layers.

Wherein the first semiconductor layer and the second semiconductor layer are made by indium gallium zinc oxide (IGZO).

Wherein the display panel further includes a color filter arranged on the second substrate.

In view of the above, the display panel includes a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer. When the gate driving signals have no bias voltage, the active first semiconductor layer and the active layer form a PN junction and a very thin space charge area is formed in the PN junction. When the gate driving signals have negative bias voltage, the direction of the external electric field is the same with that of the internal electric field of the PN junction. The space charge area is enlarged and the shifted channel of the electrons is reduced. As such, the leakage current of the TFTs may be reduced, which also reduces the cross-talk and the flicker of the liquid crystal panel.

DETAILED DESCRIPTION OF THE EMBODIMENTS

Embodiments of the invention will now be described more fully hereinafter with reference to the accompanying drawings, in which embodiments of the invention are shown.

Figure 1:
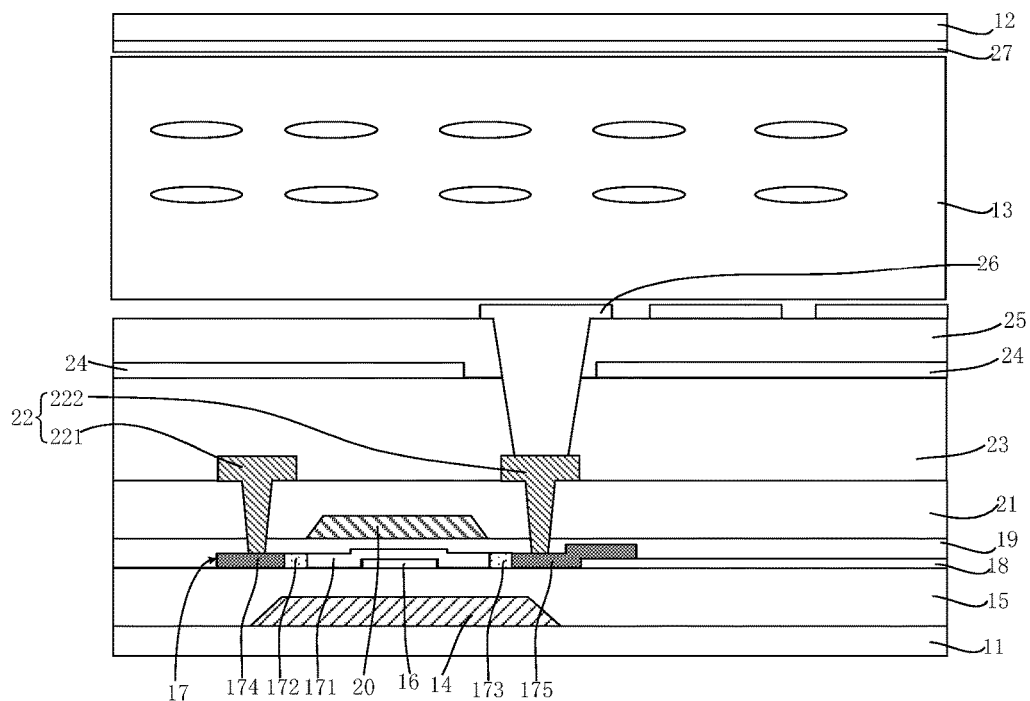
FIG. 1 is a schematic view of the display panel in accordance with one embodiment.

FIG. 1 is a schematic view of the display panel in accordance with one embodiment. The display panel includes a first substrate 11, a second substrate 12, a liquid crystal layer 13 between the first substrate 11 and the second substrate 12, a masking layer 14 on the first substrate 11, a buffering layer 15 arranged on the masking layer 14 and the first substrate 11, a first semiconductor layer 16 on the buffering layer 15, and an active layer 17 on the first semiconductor layer 16 and the buffering layer 15.

As the first semiconductor layer 16 is formed below the active layer 17, when the gate driving signals have no bias voltage, the active first semiconductor layer 16 and the active layer 17 form a PN junction and a very thin space charge area is formed in the PN junction. When the gate driving signals have negative bias voltage, the direction of the external electric field is the same with that of the internal electric field of the PN junction. The space charge area is enlarged and the shifted channel of the electrons is reduced. As such, the leakage current of the TFTs may be reduced, which also reduces the cross-talk and the flicker of the liquid crystal panel.

Preferably, the active layer 17 includes an intrinsic portion 171, a first light-doping porting 172 and a second light-doping portion 173 respectively arranged at two lateral sides of the intrinsic portion 171, a first heavy-doping portion 174 arranged at one side of the first light-doping porting 172 facing away the intrinsic portion 171, a second heavy-doping portion 175 arranged at one side of the second light-doping portion 173 facing away the intrinsic portion 171, and the intrinsic portion 171 completely covers the first semiconductor layer 16.

As shown in FIG. 1, the intrinsic portion 171 completely covers the first semiconductor layer 16 such that the first semiconductor layer 16 has not contacted with the first light-doping porting 172, the second light-doping portion 173, the first heavy-doping portion 174, or the second heavy-doping portion 175. This configuration ensures that the drain and the source are not directly connected when the gate driving signals have no bias voltage.

Preferably, the active layer 17 is a polysilicon semiconductor layer 17. In other embodiments, the active layer 17 may be the active layer of other types.

Preferably, the display panel further includes a second semiconductor layer 18, a gate insulation layer 19 arranged above the active layer 17, the second semiconductor layer 18, and the buffering layer 15, a first metal layer 20 arranged above the gate insulation layer 19, an interlayer dielectric layer 21 arranged on the first metal layer 20, a second metal layer 22 arranged on the interlayer dielectric layer 21, a planarization layer 23 on the second metal layer 22 and the interlayer dielectric layer 21, a common electrode layer 24 on the planarization layer 23, a passivation layer 25 on the planarization layer 23 and the common electrode layer 24, and a transparent electrode layer 26 on the passivation layer 25. The second metal layer 22 is connected with the active layer 17 via the through holes arranged on the interlayer dielectric layer 21 and the gate insulation layer 19. The transparent electrode layer 26 is connected with the second metal layer 22 via the through holes arranged on the passivation layer 25 and the planarization layer 23. The common electrode layer 24 is arranged in a corresponding top or bottom area of the second semiconductor layer 18. The transparent electrode layer 26 is arranged in a corresponding area of the common electrode layer 24, and the active layer 17 is arranged on the second semiconductor layer 18. Preferably, a projection of the common electrode layer 24 on the second semiconductor layer 18 fully overlaps with the second semiconductor layer 18, which contributes to the formation of the storage capacitance. In other embodiments, the projection of the common electrode layer 24 on the second semiconductor layer 18 may be partially overlapped with the second semiconductor layer 18.

Figure 2:
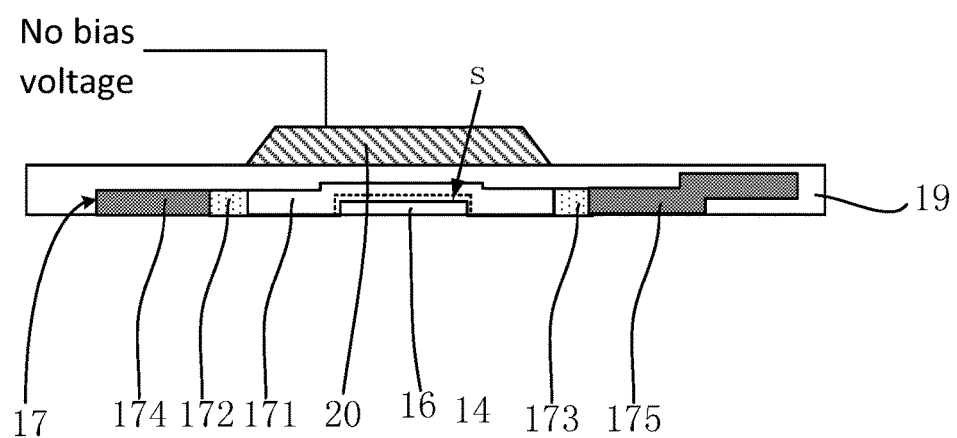
FIG. 2 is a schematic view showing the charge distribution when the gate driving signals include no bias voltage in accordance with one embodiment.

FIG. 2 is a schematic view showing the charge distribution when the gate driving signals include no bias voltage in accordance with one embodiment. When the gate driving signals have no bias voltage, the first semiconductor layer 16 and the intrinsic portion 171 of the active layer 17 form the PN junction, and a very thin space charge area is formed at the intersection of the intrinsic portion 171 and the first semiconductor layer 16.

Figure 3:
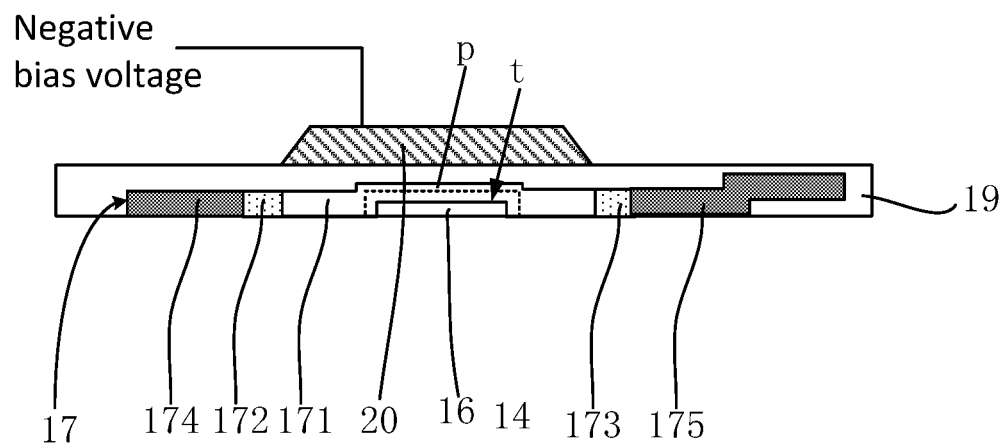
FIG. 3 is a schematic view showing the charge distribution when the gate driving signals include negative bias voltages in accordance with one embodiment.

FIG. 3 is a schematic view showing the charge distribution when the gate driving signals include negative bias voltages in accordance with one embodiment. when the gate driving signals have the negative bias voltage, as the direction of the external electric field is the same with that of the internal electric field of the PN junction, which enlarges the space charge area (s), forms a larger space charge area (t), reduces the shifted channel of the electrons (p), that is, the shifted channel of the electrons (p) is narrowed. In this way, the leakage current of the TFTs may be reduced, and so does the cross-talk and the flicker of the liquid crystal panel.

It can be understood that the gate driving signals are the voltage signals applied on the first metal layer 20, and the first metal layer 20 is the gate layer.

Preferably, at least a portion of the second heavy-doping portion 175 is on the second semiconductor layer 18.

Further, a storage capacitance (Cst2) is formed between the second semiconductor layer 18 and the common electrode layer 24 for the reasons including: the second semiconductor layer 18 is connected with the second metal layer 22 via the second heavy-doping portion 175, and the second semiconductor layer 18 is arranged in the corresponding top or corresponding bottom area of the common electrode layer 24. The total storage capacitance is the storage capacitance (Cst2) plus the storage capacitance (Cst1) between the transparent electrode layer 26 and the common electrode layer 24. Compared to conventional display panel, the storage capacitance is increased, which reduces the flicker and cross-talk.

Preferably, the second metal layer 22 includes a first sub-metal layer 221 and a second sub-metal layer 222, the first sub-metal layer 221 is connected with the first heavy-doping portion 174 via at least one through hole arranged on the interlayer dielectric layer 21 and the gate insulation layer 19, the second sub-metal layer 222 is connected with the second heavy-doping portion 175 via the through hole arranged on the interlayer dielectric layer 21 and the gate insulation layer 19, and the transparent electrode layer 26 is connected with the second sub-metal layer 222 via the through hole arranged on the passivation layer 25 and the planarization layer 23.

Preferably, the first sub-metal layer 221 is a source layer, and the second sub-metal layer 222 is a drain layer. It can be understood that, in other embodiments, the first sub-metal layer 221 may be the drain layer, and the second sub-metal layer 222 may be the source layer.

Preferably, the first semiconductor layer 16 and the second semiconductor layer 18 are of N-type semiconductor layers.

Preferably, the first semiconductor layer 16 and the second semiconductor layer 18 are made by indium gallium zinc oxide (IGZO). Due to the transparent characteristics of the IGZO, the aperture rate of the display panel may not be affected by the first semiconductor layer 16 and the second semiconductor layer 18.

Preferably, the display panel further includes a color filter 27 arranged on the second substrate 12. It can be understood that the display panel may further include a supporting pillar between the first substrate 11 and the second substrate 12, or the display panel may further include other film layers on the first substrate 11 or on the second substrate 12, such as a polarizer.

Preferably, the display panel is a FFS display panel. In other embodiments, the display panel may be the display panel of other types.

Figure 4:
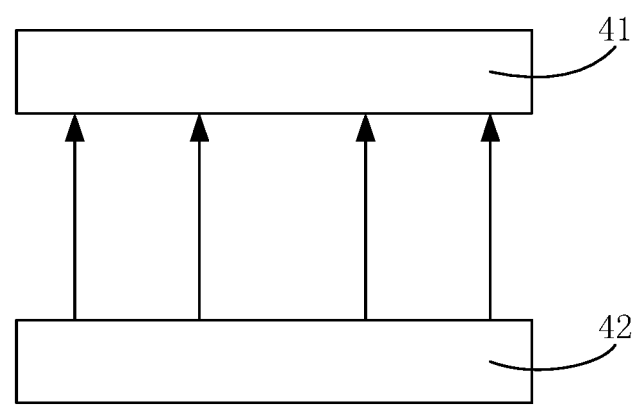
FIG. 4 is a schematic view of the display device in accordance with one embodiment.

FIG. 4 is a schematic view of the display device in accordance with one embodiment. The display device includes a display panel 41 and a backlight module 42 providing a backlight to the display panel 41. The display panel 41 may be the display panel in any one of the above embodiments.

In view of the above, the display panel includes a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer. When the gate driving signals have no bias voltage, the active first semiconductor layer and the active layer form a PN junction and a very thin space charge area is formed in the PN junction. When the gate driving signals have negative bias voltage, the direction of the external electric field is the same with that of the internal electric field of the PN junction. The space charge area is enlarged and the shifted channel of the electrons is reduced. As such, the leakage current of the TFTs may be reduced, which also reduces the cross-talk and the flicker of the liquid crystal panel.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display panel, comprising:
   a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer;
   wherein the active layer comprises an intrinsic portion, a first light-doping portion and a second light-doping portion respectively arranged at two lateral sides of the intrinsic portion, a first heavy-doping portion arranged at one side of the first light-doping portion facing away the intrinsic portion, a second heavy-doping portion arranged at one side of the second light-doping portion facing away the intrinsic portion, the intrinsic portion completely covers the first semiconductor layer, and a material of the intrinsic portion is different from a material of the first semiconductor layer;
   the display panel further comprises a second semiconductor layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

2. The display panel as claimed in claim 1, wherein at least a portion of the second heavy-doping portion is on the second semiconductor layer.

3. The display panel as claimed in claim 1, wherein the second metal layer comprises a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

4. A display panel, comprising:
   a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer; and the active layer comprises an intrinsic portion, a first light-doping portion and a second light-doping portion respectively arranged at two lateral sides of the intrinsic portion, a first heavy-doping portion arranged at one side of the first light-doping portion facing away the intrinsic portion, a second heavy-doping portion arranged at one side of the second light-doping portion facing away the intrinsic portion, the intrinsic portion covers the first semiconductor layer, and a material of the intrinsic portion is different from a material of the first semiconductor layer.

5. The display panel as claimed in claim 4, wherein the intrinsic portion completely covers the first semiconductor layer.

6. The display panel as claimed in claim 4, wherein the display panel further comprises a second semiconductor layer on the buffering layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

7. The display panel as claimed in claim 6, wherein the first semiconductor layer and the second semiconductor layer are N-type semiconductor layers.

8. The display panel as claimed in claim 7, wherein the first semiconductor layer and the second semiconductor layer are made by indium gallium zinc oxide (IGZO).

9. The display panel as claimed in claim 4, wherein the intrinsic portion partially covers the first semiconductor layer.

10. The display panel as claimed in claim 9, wherein the second metal layer comprises a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

11. The display panel as claimed in claim 4, wherein the display panel further comprises a color filter arranged on the second substrate.

12. The display panel as claimed in claim 4, wherein the active layer is a polysilicon semiconductor layer, and the display panel is a fringe field switching (FFS) display panel.

13. A display device, comprising:
a display panel and a backlight module providing a backlight to the display panel, the display panel comprises:
a first substrate, a second substrate, a liquid crystal layer between the first substrate and the second substrate, a masking layer on the first substrate, a buffering layer arranged on the masking layer and the first substrate, a first semiconductor layer on the buffering layer, and an active layer on the first semiconductor layer and the buffering layer; and the active layer comprises an intrinsic portion, a first light-doping portion and a second light-doping portion respectively arranged at two lateral sides of the intrinsic portion, a first heavy-doping portion arranged at one side of the first light-doping portion facing away the intrinsic portion, a second heavy-doping portion arranged at one side of the second light-doping portion facing away the intrinsic portion, the intrinsic portion covers the first semiconductor layer, and a material of the intrinsic portion is different from a material of the first semiconductor layer.

14. The display device as claimed in claim 13, wherein the intrinsic portion completely covers the first semiconductor layer.

15. The display device as claimed in claim 13, wherein the display panel further comprises a second semiconductor layer on the buffering layer, a gate insulation layer arranged above the active layer, the second semiconductor layer, and the buffering layer, a first metal layer arranged above the gate insulation layer, an interlayer dielectric layer arranged on the first metal layer, a second metal layer arranged on the interlayer dielectric layer, a planarization layer on the second metal layer and the interlayer dielectric layer, a common electrode layer on the planarization layer, a passivation layer on the planarization layer and the common electrode layer, and a transparent electrode layer on the passivation layer, the second metal layer is connected with the active layer via at least one through hole arranged on the interlayer dielectric layer and the gate insulation layer, the transparent electrode layer is connected with the second metal layer via the through hole arranged on the passivation layer and the planarization layer, the common electrode layer is arranged in a corresponding top or bottom area of the second semiconductor layer, the transparent electrode layer is arranged in a corresponding area of the common electrode layer, and the active layer is arranged on the second semiconductor layer.

16. The display device as claimed in claim 15, wherein the first semiconductor layer and the second semiconductor layer are N-type semiconductor layers.

17. The display device as claimed in claim 16, wherein the first semiconductor layer and the second semiconductor layer are made by indium gallium zinc oxide (IGZO).

18. The display device as claimed in claim 13, wherein the intrinsic portion partially covers the first semiconductor layer.

19. The display device as claimed in claim 18, wherein the second metal layer comprises a first sub-metal layer and a second sub-metal layer, the first sub-metal layer is connected with the first heavy-doping portion via at least one through hole arranged on the interlayer dielectric layer and the gate insulation layer, the second sub-metal layer is connected with the second heavy-doping portion via the through hole arranged on the interlayer dielectric layer and the gate insulation layer, and the transparent electrode layer is connected with the second sub-metal layer via the through hole arranged on the passivation layer and the planarization layer.

20. The display device as claimed in claim 13, wherein the display panel further comprises a color filter arranged on the second substrate.

* * * * *